United States Patent
Dommaschk et al.

(10) Patent No.: US 8,164,868 B2
(45) Date of Patent: Apr. 24, 2012

(54) DEVICE FOR SHORT-CIRCUITING POWER SEMICONDUCTOR MODULES

(75) Inventors: Mike Dommaschk, Guteborn (DE); Jörg Dorn, Buttenheim (DE); Johann Holweg, Zirndorf (DE); Jörg Lang, Stadtsteinach (DE); Axel Preidel, Buckenhof (DE); Klaus Würflinger, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 857 days.

(21) Appl. No.: 12/280,562

(22) PCT Filed: Feb. 23, 2006

(86) PCT No.: PCT/DE2006/000344
§ 371 (c)(1),
(2), (4) Date: Oct. 16, 2008

(87) PCT Pub. No.: WO2007/095873
PCT Pub. Date: Aug. 30, 2007

(65) Prior Publication Data
US 2009/0141416 A1   Jun. 4, 2009

(51) Int. Cl.
*H02H 9/00* (2006.01)
(52) U.S. Cl. ............................................. 361/54
(58) Field of Classification Search .......... 361/13, 361/54
See application file for complete search history.

(56) References Cited

U.S. PATENT DOCUMENTS

| | | | | |
|---|---|---|---|---|
| 3,564,305 A | * | 2/1971 | Cummings | 310/10 |
| 5,422,779 A | * | 6/1995 | Borkowicz et al. | 361/119 |
| 5,811,894 A | * | 9/1998 | Buyers et al. | 307/118 |
| 5,982,031 A | * | 11/1999 | Stockmeier | 257/723 |
| 6,046,514 A | | 4/2000 | Rouillard et al. | |
| 6,675,692 B1 | * | 1/2004 | Goetz | 89/1.14 |

FOREIGN PATENT DOCUMENTS

| | | |
|---|---|---|
| EP | 1282145 A1 | 2/2003 |
| GB | 1321381 | 6/1973 |
| GB | 2153609 A | 8/1985 |
| JP | 54094632 A | 7/1979 |
| JP | 55039630 A | 3/1980 |
| JP | 2001511634 T | 8/2001 |
| WO | 9741582 A1 | 11/1997 |

OTHER PUBLICATIONS

International Search Report dated Oct. 11, 2006.

* cited by examiner

*Primary Examiner* — Stephen W Jackson
(74) *Attorney, Agent, or Firm* — Laurence A. Greenberg; Werner H. Stemer; Ralph E. Locher

(57) ABSTRACT

An apparatus has power semiconductor modules, which are connected to one another via connection devices so as to form a series circuit. A short-circuiting device for short-circuiting the respective power semiconductor module is assigned to each power semiconductor module. The apparatus has a reliable and at the same time cost-effective short-circuiting device. It is proposed that the short-circuiting device is a pyrotechnical/mechanical element, which has a detonation charge and a tripping device, which can be displaced by the detonation charge.

10 Claims, 2 Drawing Sheets

DEVICE FOR SHORT-CIRCUITING POWER SEMICONDUCTOR MODULES

BACKGROUND OF THE INVENTION

Field of the Invention

The invention relates to an apparatus having power semiconductor modules which are connected to one another via connection means, forming a series circuit, with each power semiconductor module having an associated short-circuiting device for short-circuiting of the respective power semiconductor module.

An apparatus such as this is already known from DE 103 23 220 A1, which describes a converter which comprises a bridge circuit with bridge arms. In this case, each bridge arm has a series circuit formed from power semiconductor modules, which are connected to one another via connection means. The two-pole power semiconductor modules have a different terminal voltage in different controllable switching states. Each power semiconductor module also comprises an internal voltage intermediate circuit with an energy store. The power semiconductor modules are not connected to one another via a pressure contact of the respective power semiconductors. A short-circuit within the power semiconductor module can therefore lead to the occurrence of arcs, resulting in explosion gases or the like. In order to draw the driving voltage from the arc, the faulty power semiconductor module is short-circuited and is in this way bridged in the series circuit. For short-circuiting, a short-circuiting device is connected in parallel on the power semiconductor module, and comprises a sacrificial component composed of semiconductors. The sacrificial component breaks down when short-circuited in the event of a fault, being destroyed in the process. The already known short-circuiting apparatus is of complex design, however, and is costly.

DE 199 55 682 A2 discloses a current-limiting device for high voltage, which has an explosive charge in order to open a main current branch. Once the main current branch has been opened, the current is commutated onto a secondary branch, which has a capacitor. The current flowing through the device is limited as a function of the impedance of the capacitor.

DE 102 54 497 B3 discloses a short-circuiting device having a light receiver whose optical output signal is used to activate a photochemical reaction of a reaction mixture. For this purpose, the light from a fault arc that has been struck is passed via optical waveguides to a reaction chamber, which is filled with the reaction mixture. The photochemical triggering of the reaction mixture leads to an explosive pressure increase in the chamber, as a result of which a short-circuiting device is in turn mechanically operated.

Furthermore, DE 225 540 A1 discloses a drive for electrical switches with explosive triggering.

BRIEF SUMMARY OF THE INVENTION

The object of the invention is to provide an apparatus of the type mentioned initially which has a reliable short-circuiting device, which at the same time is cost-effective.

The invention achieves this object in that the short-circuiting device is a pyrotechnic/mechanical element which has an explosive charge and an initiation means which can be moved by the explosive charge.

For the purposes of the invention, a cost-effective pyrotechnic/mechanical element is used to bridge a power semiconductor module. Pyrotechnic/mechanical elements such as these have, for example, been known in the form of belt tighteners or for opening armoured vehicles. In addition to a quick reaction time, they are extremely highly reliable. Furthermore, only a limited amount of energy is required to initiate the explosive charge although the resultant pressure wave results in high forces being introduced into the initiation means, which are mounted such that they can move in the remaining components of the pyrotechnic/mechanical element. The initiation means are expediently mounted such that they can move only over a predetermined movement distance when initiated. This makes it possible to even further avoid damage to sensitive components in the apparatus according to the invention. According to the invention, this allows reliable switching even over long lives. The use of the pyrotechnic/mechanical element therefore allows apparatuses according to the invention to be designed, such as converters, which are of modular design, with the individual modules being connected via connection means. Complex pressure contact with the individual power semiconductors has therefore become superfluous. The converters can thus be produced cost-effectively. In the event of a short-circuit, the faulty power semiconductor module can be reliably short-circuited by means of the pyrotechnic/mechanical element such that damage to the remaining components in the converter or to people in the vicinity of the converter is, according to the invention, reliably avoided. Pyrotechnic initiations have admittedly already become known in the field of power distribution. However, the invention has identified the fact that explosive charges can also be used in conjunction with sensitive power semiconductors. To this end, for the purposes of the invention, each pyrotechnic/mechanical element is arranged with respect to the power semiconductor modules, and is equipped in such a way, that it is reliably possible to preclude said damage resulting from the explosion that then takes place on initiation.

Each power semiconductor module expediently has at least one associated energy store, for example at least one capacitor.

According to one advantageous refinement of the invention, the pyrotechnic/mechanical element has a housing in which the explosive charge is arranged. By way of example, the housing provides protection for the power semiconductor modules. The housing is expediently made thick enough to avoid bursting of the housing or of other parts of the pyrotechnic/mechanical element in the event of an explosion.

According to one expedient further development of the invention in this context, the housing is gas-tight when initiated, so as to avoid the occurrence of explosive gases. This can virtually completely avoid the risk of damage to the power semiconductor modules by the explosive charge in the event of an explosion. The pyrotechnic/mechanical element is designed such that all that occurs is mechanical movement of the initiation means on initiation. According to this further development, no further side effects occur within the scope of the invention. In this context, pyrotechnic/mechanical elements have become known which heat up only to about 60° Celsius after the explosive charge has been triggered at room temperature, and without releasing external explosive gases.

The pyrotechnic/mechanical element advantageously has at least two drive connections for initiation of the explosive charge. The provision of two drive connections allows the explosive charge to be driven redundantly, thus even further improving the initiation reliability.

The pyrotechnic/mechanical element is advantageously composed of at least one electrically conductive material and, in an initiation position, connects the series circuit to a bypass branch such that a power semiconductor module which is associated with the pyrotechnic/mechanical element is bridged. According to this further development of the invention, current flows via the pyrotechnic/mechanical element itself in the event of a fault. In other words, the pyrotechnic/mechanical element is part of the bypass branch for the faulty power semiconductor module.

The pyrotechnic/mechanical element can expediently be triggered electrically. Electrical triggering such as this is both reliable and cost-effective.

According to one further development in this context, the pyrotechnic/mechanical element has at least one measurement sensor for detection of an electrical signal to be monitored of the associated power semiconductor module, with each measurement sensor being connected to an initiation unit which is designed for electrical triggering of the explosive charge. By way of example, the initiation unit is equipped with expedient logic which is designed to check the signal to be monitored, using internal logic. The signal to be monitored is, for example, proportional to a voltage which, for example, is dropped across a capacitor in the power semiconductor module to be monitored, to a current or to a rate of change of said voltage or of said current. If a voltage is monitored, the measurement sensor is, for example, a calibrated voltage converter which produces a voltage signal that is dependent on the voltage and is sampled by the initiation unit in order to obtain sample values, with the sample values being converted to digital voltage measured values by an analog/digital converter. The digital voltage measured values may, for example, be compared with a configured threshold value. In contrast to this, however, analog evaluation of the measurement sensor signals is possible. Initiation processes such as these are, however, very well known to a person skilled in the art, so that there is no need to describe them in any more detail at this point.

The movable initiation means can advantageously be moved by the explosive charge into the housing. Pyrotechnic/mechanical elements such as these have become commercially available under the name "pin-puller". According to this advantageous further development, the pyrotechnic/mechanical element acts like an interlock, with the interlock being released after initiation of the explosive charge and, for example, with a prestressed spring being released, which closes an associated switch or contact.

It is, of course, also possible to move the movable initiation means out of the housing, such that the switching movement of the pyrotechnic/mechanical element can be produced directly. The switching movement is then introduced into expedient kinematics such that contacts to bridge the respectively associated power semiconductor module are closed. Pyrotechnic/mechanical elements have become known, for example, by the name pyrotechnic actuators. The movement distance of the movement is advantageously also designed to be limited in this case, thus avoiding the risk of damage to further components in the apparatus.

The apparatus according to the invention expediently has an auxiliary contact which can be used to check whether the pyrotechnic/mechanical element has been initiated after triggering.

Further expedient refinements and advantages of the invention are the subject matter of the following description of exemplary embodiments of the invention with reference to the figures of the drawing, in which the same reference symbols refer to components having the same effect, and in which:

DESCRIPTION OF THE INVENTION

Figure 1:
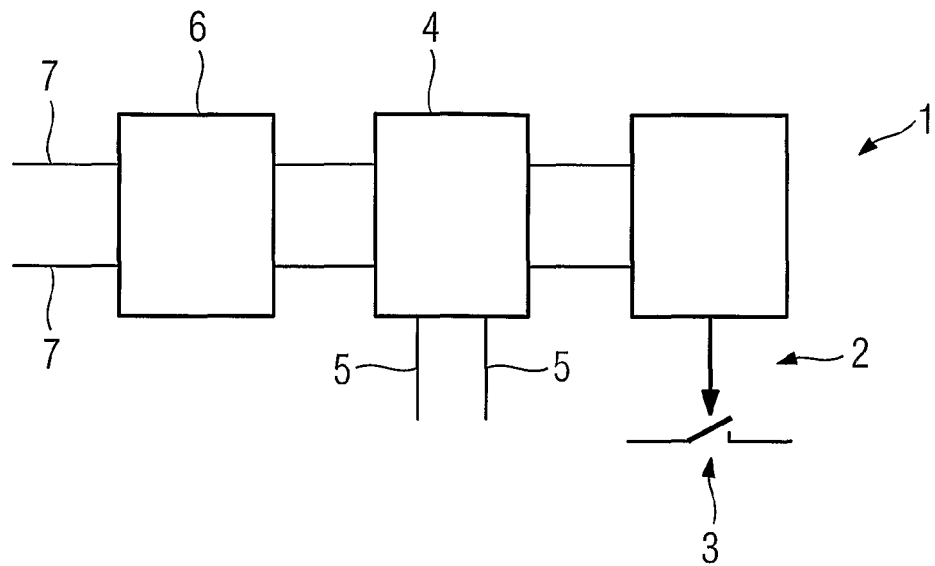
FIG. 1 shows a pyrotechnic/mechanical element having an initiation unit, illustrated schematically.

FIG. 1 shows one exemplary embodiment of a pyrotechnic/mechanical element 1, which has a gas-tight housing in which an explosive charge is arranged. The initiation of the explosive charge leads to movement of an initiation means, which cannot be seen in FIG. 1 but whose drive movement is introduced into expedient kinematics 2 in order to close a switch or a short-circuiting device 3. When the switch 3 is closed, this results in bridging of a power semiconductor module which is arranged in a series circuit of power semiconductor modules. Said series circuit is part of a converter.

A drive unit 4 is provided in order to initiate the pyrotechnic/mechanical element and is connected via connection lines 5 to measurement sensors, which are not illustrated in the drawing in FIG. 1.

In the exemplary embodiment shown in FIG. 1, the drive unit is used to monitor a power semiconductor module 1 which has an energy store, for example in the form of a capacitor, which is not illustrated in the figures but is associated with said power semiconductor module 1. The drive unit 4 uses the connection lines 5 to monitor the voltage dropped across the capacitor. In the event of a short circuit, the voltage rapidly collapses. If this gradient exceeds a specific predetermined threshold, the drive unit initiates an explosion of the explosive charge in the pyrotechnic/mechanical element 1, thus leading to closing of the switch 3. This results in the faulty power semiconductor module being bridged, therefore allowing current flow via the other power semiconductor modules 1 which are connected in series with the faulty power semiconductor module 1.

Furthermore, it is possible to detect whether a specific voltage threshold has been exceeded, and it is possible to deduce a fault within the power semiconductor module 1 from this. In this case, this power semiconductor module is short-circuited immediately, for example in order to avoid a further increase in the capacitor voltage which is dropped across a capacitor in the power semiconductor module, and therefore a greater energy content in said capacitor.

Electrical power supply electronics 6 are provided in order to supply power to the drive unit, and are connected to an electrical power supply via connecting lines 7.

Figure 2:
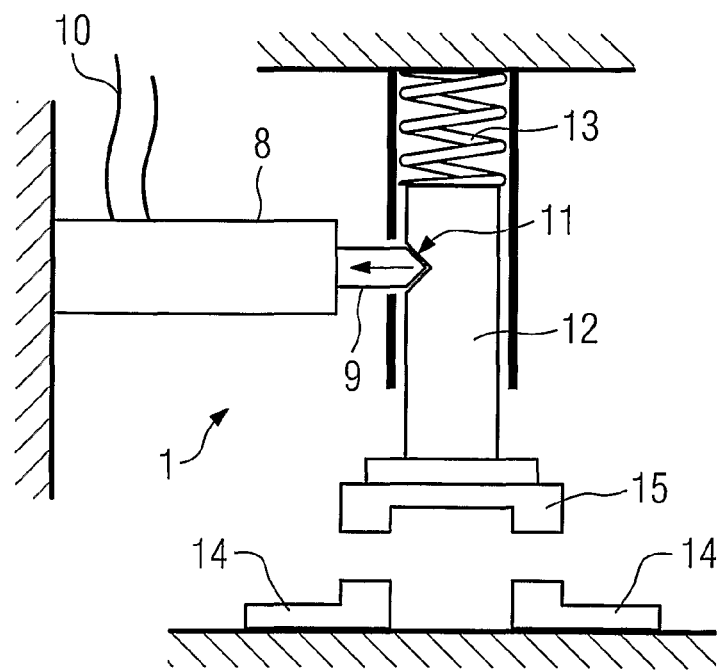
FIG. 2 shows an exemplary embodiment of a pyrotechnic/mechanical element.

FIG. 2 shows one exemplary embodiment of the pyrotechnic/mechanical element 1, which has a housing 8, a switching pin 9 and a drive line 10. The explosion of the explosive charge in the interior of the housing 8 results in the switching pin 9 being moved into the housing 8. In this case, the housing 8 is designed to be gas-tight, by the use of expedient seals, thus avoiding the occurrence of explosive gases outside the housing, despite the explosion of the explosive charge. Damage to the sensitive power semiconductor components is therefore avoided for the purposes of this further development of the invention.

In the illustrated exemplary embodiment, the switching pin 9 is used for interlocking. For this reason, the tip of the switching pin 9 is shown as being conical, with the conical tip engaging in a complementary recess 11 in a switching rod 12. During normal operation, a compression spring 13 is prestressed by the interlocked switching rod 12. After initiation of the pyrotechnic/mechanical element 1, the interlocking of the compression spring 13 is cancelled, and the compression spring 13 is released, thus leading to the contact link 15 bridging the contacts 14. When the contact link 15 makes contact with the contacts 14, the associated faulty power semiconductor component is bridged.

Figure 3:
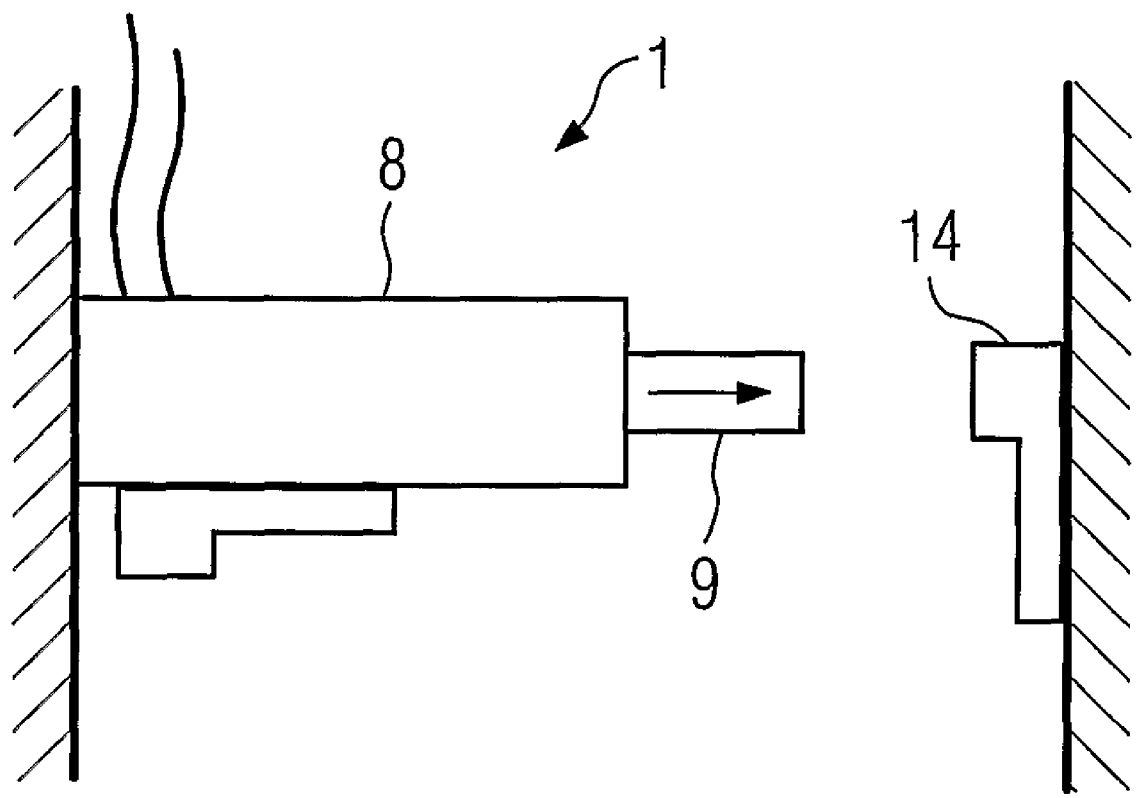
FIG. 3 shows a further exemplary embodiment as shown in FIG. 2.

FIG. 3 shows a further exemplary embodiment of the pyrotechnic/mechanical element 1 which, in the illustrated exemplary embodiment, is manufactured completely from a conductive material, for example a suitable metal. Corresponding to the exemplary embodiment shown in FIG. 2, the pyrotechnic element 1 illustrated in FIG. 3 has a housing 8 as well as a switching pin 9, in which case, in contrast to the exemplary embodiment shown in FIG. 2, the switching pin 9 is designed such that it can be moved out of the housing 8 in the event of explosion of the explosive charge. In the illustrated operating position, the switching pin 9 is disconnected from the mating contact 14. However, in the moved-out position, a contact is made between the switching pin 9 and the mating contact 14, thus allowing a current to flow via the pyrotechnic/mechanical element 1, bridging the faulty power semiconductor module.

The invention claimed is:

1. An apparatus, comprising:
power semiconductor modules connected in series with one another to form a series circuit, each respective one of said power semiconductor modules having an associated short-circuiting device for short-circuiting said respective power semiconductor module, said short-circuiting device being a pyrotechnic/mechanical element having an explosive charge and an initiation means being moved by said explosive charge.

2. The apparatus according to claim 1, wherein said pyrotechnic/mechanical element has a housing in which said explosive charge is disposed.

3. The apparatus according to claim 2, wherein said housing is gas-tight when initiated, so as to avoid an occurrence of explosive gases.

4. The apparatus according to claim 1, wherein said pyrotechnic/mechanical element has at least two drive connections for initiation of said explosive charge.

5. The apparatus according to claim 1, wherein said pyrotechnic/mechanical element is composed of an electrically conductive material and, in an initiation position, connects said series circuit to a bypass branch such that said respective power semiconductor module associated with said pyrotechnic/mechanical element is short-circuited.

6. The apparatus according to claim 1, wherein said pyrotechnic/mechanical element can be triggered electrically.

7. The apparatus according to claim 1, further comprising an initiation unit configured for electrical triggering of said explosive charge; and wherein said pyrotechnic/mechanical element has at least one measurement sensor for detection of an electrical signal to be monitored of an associated one of said power semiconductor modules, said measurement sensor connected to said initiation unit.

8. The apparatus according to claim 2, wherein said initiation means can be moved by said explosive charge one of into said housing and out of said housing.

9. The apparatus according to claim 1, wherein said power semiconductor modules form part of a converter.

10. The apparatus according to claim 1, further comprising a drive unit triggering said explosive charge of said short-circuiting device when a voltage gradient exceeds a predetermined threshold.

* * * * *